(12) United States Patent
Okuda

(10) Patent No.: US 7,446,615 B2
(45) Date of Patent: *Nov. 4, 2008

(54) SEMICONDUCTOR INTEGRATED CIRCUIT WITH CLOCK GENERATOR

(75) Inventor: Yuichi Okuda, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 85 days.

This patent is subject to a terminal disclaimer.

(21) Appl. No.: 11/600,205

(22) Filed: Nov. 16, 2006

(65) Prior Publication Data

US 2007/0063776 A1 Mar. 22, 2007

Related U.S. Application Data

(63) Continuation of application No. 10/940,646, filed on Sep. 15, 2004, now Pat. No. 7,154,343.

(30) Foreign Application Priority Data

Oct. 9, 2003 (JP) .............................. 2003-350287

(51) Int. Cl.
*H03L 7/00* (2006.01)

(52) U.S. Cl. .............................. 331/16; 331/44; 331/17

(58) Field of Classification Search ................. 331/16; 713/601
See application file for complete search history.

(56) References Cited

U.S. PATENT DOCUMENTS

| 6,154,095 A | 11/2000 | Shigemori et al. ............ 331/16 |
| 2002/0062457 A1 | 5/2002 | Kamihara ................... 713/600 |
| 2004/0222856 A1 | 11/2004 | Hein et al. .................... 331/16 |

FOREIGN PATENT DOCUMENTS

| JP | 2001-230837 | 8/2001 |
| JP | 2002-141911 | 5/2002 |

*Primary Examiner*—Joseph Chang
(74) *Attorney, Agent, or Firm*—Miles & Stockbridge P.C.

(57) ABSTRACT

A semiconductor integrated circuit is provided with an external interface circuit, which includes a clock generation circuit for generating a synchronous clock signal to establish synchronization between data input and output through input and output of a data string sectioned at fixed intervals. The clock generation circuit includes a self-excited oscillator circuit serving as an oscillation source for the synchronous clock signal, and a control circuit for trimming the oscillation frequency of the self-excited oscillator circuit. The control circuit detects the sections made at the fixed intervals to the data string, measures the section interval based on an oscillation output of the self-excited oscillator circuit, and controls the oscillation frequency of the self-excited oscillator circuit to match the measurement value to a target value. With such a structure, any required frequency can be oscillated in a self-excited manner using a data string sectioned at fixed intervals using SOF packets or others instead of an oscillator.

11 Claims, 6 Drawing Sheets

SEMICONDUCTOR INTEGRATED CIRCUIT WITH CLOCK GENERATOR

CROSS-REFERENCE TO RELATED APPLICATION

This application is a continuation of application Ser. No. 10/940,646 filed Sep. 15, 2004 now U.S. Pat. No. 7,154,343.

BACKGROUND OF THE INVENTION

1. Field of the Invention

The present invention relates to a semiconductor integrated circuit, and a clock oscillation technology that is effective when applied to a slave device exemplified by a USB (Universal Serial Bus) client for performing Plesiochronous communications with a main device through connection therewith.

2. Description of the Related Art

In recent years, USB has become increasingly popular for establishing connections between personal computers (PCs) and their peripheral devices, and accordingly various peripheral devices in the market are becoming USB-compliant.

In Patent Document 1 (JP-A-2001-230837), for example, there is a description about Isochronous communications in a telephone system using USB. To be specific, two counters are used to suppress noise occurrence to be caused by audio data slipping resulted from clock difference between a PC and the telephone system. One counter is used to count frame signals called SOFs coming from the PC in a cycle of about a millisecond (ms) in an asynchronous transfer mode. The other counter is provided to count frames synchronous with clocks of a switched telephone network. As to their resulting counter values, a difference therebetween is taken to use it as a basis for clock selection for the telephone system.

In Patent Document 2 (JP-A-2002-141911), disclosed is the technology dealing with two modes for clock switching, i.e., full speed mode (12 MHz) defined by the USB 1.1 specification, and a high speed mode (480 MHz) newly defined by the USB 2.0. Such clock switching is done depending on which mode, and aimed to reduce the power consumption of PLLs those generating sampling clocks.

SUMMARY OF THE INVENTION

The inventor of the present invention has studied about the possibility of USB compliance with respect to IC cards, often used for credit cards and specified by the international standards ISO 7816. To charge to credit cards over the Internet, for example, users are required to enter their credit card details, e.g., card number and expiration date, directly into any corresponding Internet sites. Surely, communications encryption is generally secured, and thus the possibility of card number theft over communications paths is negligible. However, there still remains a possibility that such information is improperly used directly in the Internet sites. As a consequence, the demand for more secure use of credit cards is continuing to grow, e.g., using IC credit cards with card numbers encrypted.

The issue here is that, with the ISO 7816 standards, a UART (Universal Asynchronous Receiver Transmitter) is supposed to be used for communications with outside. The UART is popularly used, and has such an advantage as being widely available at low cost. Conversely, the UART is regarded as earlier model for the standards, and difficult for automatic recognition. In this sense, the UART has a problem in the usability when users use it with their PCs.

For betterment, there has been a growing demand for a USB which is equipped, almost without exception, to the PCs of the current type, and usability of which is high. With the ISO 7816 standards, two terminals reserved for future use (RFU) are specified, and assigning respectively thereto D+ (Data+) and D− (Data−) both serving as a USB communications terminal will make those RFUs USB-compliant.

USB equipment performs Plesiochronous transmission in which clock drift compensation is automatically completed. For such automatic clock compensation, a reference oscillator circuit is each provided to the side of starting communications (USB host device) and the side of receiving the communications (USB function device) to reduce any clock drift occurring therebetween to a standards-specified reference value. With the USB standards, a clock drift occurring exemplarily in FS (Full Speed) devices needs to satisfy ±2500 ppm. This accordingly requires USB-compliant devices to each include an oscillator circuit assuring such a standards-satisfying precision. For the purpose, a ceramic oscillator or a quartz oscillator is a general option.

The problem here is that the ceramic oscillator or others is found difficult to be individually accommodated in an IC card due to its limited physical space. In consideration thereof, the inventor of the present invention has acknowledged the need for incorporating a reference oscillator circuit in a semiconductor integrated circuit (LSI).

The inventor of the present invention also has acknowledged that including an oscillator in an LSI has likewise good effects for some other USB equipment. Exemplarily for game input devices expected to be less expensive, the fewer number of external components is considered better. Such input devices do not need the precision of ±2500 ppm or higher, and thus incorporating one reference oscillator circuit into a USB communications chip is enough. As such, the resulting system can be considerably cheap in cost.

The problem here is that integrating a self-excited reference oscillator into an LSI chip will additionally require frequency adjustment to be performed. This frequency adjustment is intended to satisfy the standards of ±2500 ppm, for example, irrespective of process variation, and any change observed for power supply voltage, temperature, or the like.

In consideration thereof, an object of the present invention is to provide a semiconductor integrated circuit with which any required frequency can be oscillated in a self-excited manner using, instead of an oscillator, a data string that is sectioned at fixed intervals by SOF (Start of Frame) packets or others.

Another object of the present invention is to provide a semiconductor integrated circuit capable of self-excited oscillation with a relatively high oscillation frequency precision.

Still another object of the present invention is to provide a semiconductor integrated circuit capable of self-excited oscillation with ±2500 ppm precision required for USB equipment when USB SOF packets has precision of ±500 ppm.

Still another object of the present invention is to reduce the cost of a card reader for establishing a connection between a USB host device and a card device typified by an IC card, and of any other USB equipment.

These and other objects and any new features of the present invention will become more apparent from the following detailed description of the present invention when taken in conjunction with the accompanying drawings.

The summary of the inventions typically disclosed herein will be briefly described below.

A first aspect of the present invention is directed to a semiconductor integrated circuit, including an external interface circuit. The external interface circuit is provided with a clock generation circuit (100) for generating a synchronous clock signal used for establishing synchronization between data input and output through input and output of a data string sectioned at fixed intervals. The clock generation circuit is provided with a self-excited oscillator circuit (120) that is an oscillation source of the synchronous clock signal, and a control circuit (110) for trimming the oscillation frequency of the self-excited oscillator circuit. The control circuit detects the sections made to the data string at fixed intervals, measures the section intervals based on the oscillation output of the self-excited oscillator circuit, and controls the oscillation frequency of the self-excited oscillator circuit in a manner to match the measured value to a target value.

With such a structure, any required frequency can be oscillated in a self-excited manner using, instead of an oscillator, a data string sectioned at fixed intervals by SOF packets or others.

As a specific embodiment of the present invention, the external interface circuit is a USB-compliant interface circuit (918), and sections made at fixed intervals are designated by SOF packets each placed at a frame head. In USB equipment, a bus never fails to carry a USB host device (generally a PC), and USB device(s) ranging in number from 0 to 127. Such USB devices always communicate only with the USB host device, and never communicate with each other. In a case of file transfer among USB-connected HDDs (Hard Disk Drives), for example, communications is carried out via a PC, i.e., from one HDD to the PC, and then to another HDD. Thus, the USB host device is required to be high in precision in comparison with any USAB (Universal Synchronous and Asynchronous Bus) devices, and actually, the USB host device is required to have precision of ±500 ppm, and ±2500 ppm for USB devices. With the USB standards, a flow of data is sectioned for every 1 ms, and each section is regarded as a Frame. At the head of each Frame, an SOF packet is forwarded from the USB host device. Here, because the USB host device is required to have precision of ±500 ppm, the SOF interval will be 1 ms ±500 ppm. Using such an SOF as a reference to correct a reference clock frequency of the USB device. The SOF is expected to achieve the precision of ±500 ppm, and thus if frequency correction of 2000 ppm is realized by using such an SOF reference, accomplished is correction of ±2500 ppm over the oscillation frequency. In such a manner, even an oscillator provided inside of a semiconductor integrated circuit can achieve precision of ±2500 ppm.

As another embodiment of the present invention, the clock generation circuit is also provided with a PLL circuit (130) for outputting a synchronous clock signal by multiplying the oscillation frequency of the self-excited oscillator circuit. The control circuit is provided with a control data register (114), a counter (112), and a determination circuit (113). The control data register is provided for storing control data that exercises control over the oscillation frequency of the self-excited oscillator circuit, and the counter is provided for counting the synchronous clock signal at fixed time intervals each designated by an SOF packet. The determination circuit is provided for determining whether any difference is observed between the measurement value of the counter and its target value, and if determined as observed, revising the control data of the control data register in a manner to reduce thus determined difference.

For such frequency correction of the self-excited oscillator circuit, section recognition made at any predetermined intervals is essential using SOF packets or others. In this sense, the self-oscillator circuit has such an oscillation precision as allowing section recognition made at any predetermined intervals using SOF packets or others.

In respect of deriving any needed oscillation precision, the self-excited oscillator circuit is provided with a constant current generation circuit for determining the oscillation frequency, for example. This constant current generation circuit is provided with a first current source (411) and a second current source (412). The first current source passes a current corresponding to the control data of the control data register, and the second current source passes a current in response to the control data that compensates any variation of the oscillation frequency resulted from process variation occurred to the self-excited oscillator circuit.

The constant current generation circuit is provided with a third current source (413), for example, that passes a current for compensating any variation of the oscillation frequency resulted from temperature change observed for the self-excited oscillator circuit.

Also in respect of deriving any needed oscillation precision, the self-excited oscillator circuit is provided with a pair of ramp circuits (420, 430), and a flip-flop (440). The ramp circuits use a current generated by the constant current generation circuit as an operating current to perform capacity charge and discharge alternately in opposite phase so as to detect whether a reference level is reached or not. The flip-flop includes a set terminal receiving an output of one of the ramp circuits, and a reset terminal receiving an output of the other ramp circuit. Based on phase-opposite outputs coming from the flip-flop, the ramp circuits are accordingly operated for capacity charge or discharge alternately in opposite phase. Here, although the capacity charge time can be controlled with high precision, the capacity discharge time generally accompanies a large error. In consideration thereof, the ramp circuits are alternately operated for capacity charge and discharge, and a time interval taken to detect whether the reference level is reached or not is used as a basis for period definition. As a result, the discharge operation often accompanying a relatively large error is apparently encapsulated by the charge operation, conducing to the clock frequency oscillation with high precision.

To reduce the chip-occupied area of the self-excited oscillator circuit, the number of the ramp circuits is reduced to one so as to reduce the chip-occupied area. If this is the case, a delay circuit and a flip-flop are to be included. The delay circuit is for delaying an output of the ramp circuit, and the flip-flop is for receiving a noninverting data output with an output from the delay circuit used as a clock. Based on the output of the delay circuit, the ramp circuit may so structured as to charge and discharge for operation alternately in opposite phase.

A second aspect of the present invention is directed to a semiconductor integrated circuit, including a central processing unit for connection to the external interface circuit. The central processing circuit uses, as an operation reference clock signal, a clock signal to be generated by the clock generation circuit. This favorably eliminates the need for an external oscillator such as a quartz oscillator to obtain the operation reference clock for the semiconductor integrated circuit. The semiconductor integrated circuit may be provided with nonvolatile memory and volatile memory for connection to the central processing unit. Such a semiconductor integrated circuit is a microcomputer for an IC card approved by any predetermined certification agency.

To apply such a semiconductor integrated circuit to a card device exemplified by an IC card and a multifunction memory card, the semiconductor integrated circuit may be mounted on a card substrate having an external connection terminal for connection to the external interface circuit in the semiconductor integrated circuit.

A card reader for establishing a connection between the card device and the USB host device includes an electrical connection path to allow detachable attachment of the card device, and connection of the USB host device with the external connection terminal of the attached card device. Herein, the on-chip oscillator circuit of the semiconductor integrated circuit equipped in the card device is in charge of generating USB sampling clocks, thereby eliminating the need for an oscillator in the card reader.

To apply the semiconductor integrated circuit into the USB interface equipment, the semiconductor integrated circuit may be so structured as to be connectable to the USB host device via the external interface circuit.

A third aspect of the present invention is directed to an oscillator circuit, including a constant current generation circuit, a pair of time measurement circuits, and a flip-flop. The time measurement circuits perform capacity charge through input of a current to be generated by the constant current generation circuit, and comparing the charge level with a reference level to output a matching therebetween. The flip-flop includes a set terminal receiving an output of one of the time measurement circuits, and a reset terminal receiving an output from the other time measurement circuit. When either of the time measurement circuits detects a level matching, responsively, the time measurement circuit is started being discharged, and the other measurement circuit is started being charged. Then, a clock signal is generated with a cycle defined based on the time interval of matching level detection. As a result, the discharge operation often accompanying a relatively large error is apparently encapsulated by the charge operation, conducing to the clock frequency oscillation with high precision.

The effects to be derived by the inventions typically disclosed herein will be briefly described below.

Instead of an oscillator, using a data string sectioned at fixed intervals using SOF packets or others to oscillate any required frequency in a self-excited manner.

Adopting a reference oscillator circuit to a semiconductor integrated circuit will favorably lead to cost reduction of IC card readers, USB equipment, and others.

DESCRIPTION OF THE MOST PREFERRED EMBODIMENT

Figure 1:
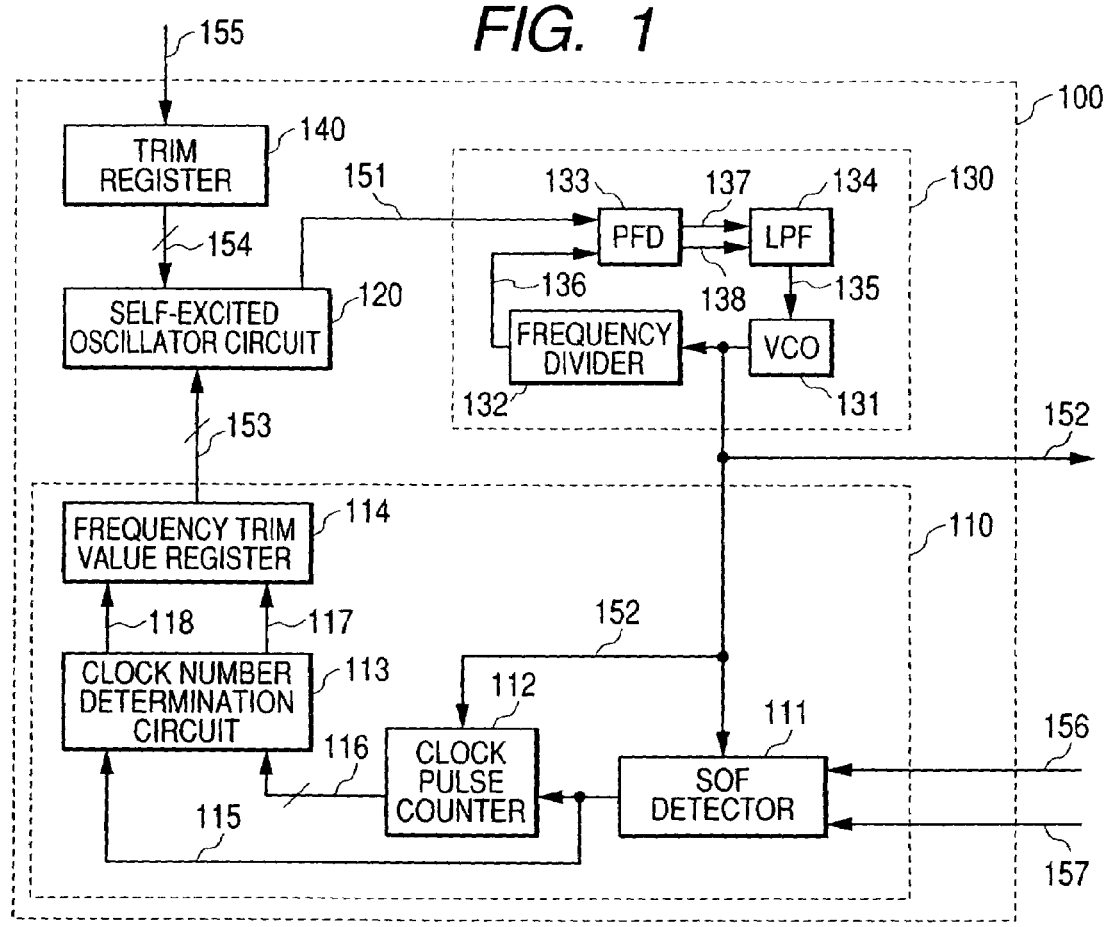
FIG. 1 is a block diagram of an exemplary reference oscillator circuit of the present invention.

FIG. 1 shows an exemplary reference oscillator circuit to be incorporated on a semiconductor integrated circuit of the present invention. In the drawing, a reference numeral 100 denotes a USB reference oscillator circuit, 110 an oscillation frequency trim circuit, 120 a self-excited oscillator circuit, 130 a PLL (Phase-Locked Loop) circuit, 140 a trim register at a manufacturing process (hereinafter, simply referred to as trim register), 151 a 1 MHz clock, 152 a 48 MHz clock, 153 an oscillation frequency trim signal, 154 a trim value at a manufacturing process (hereinafter, simply referred to as trim value), 155 a trim signal set at a manufacturing process (hereinafter, simply referred to as trim signal), 156 a D+ signal, and 157 a D− signal. Herein, the D+ and D− signals 156 and 157 are both a USB data signal.

Although not specifically confining the present invention within narrow limits, an oscillator circuit of this example is presumably a reference oscillator circuit that is specifically designed for a USB transmission/reception circuit supporting Full Speed mode (12 Mbps) of the USB standards 2.0. The general USB reception circuit is with 4×-oversampling, and thus with the USB transmission/reception circuit supporting the Full Speed mode, required is a reference clock of 48 MHz.

The oscillator circuit in this example starts oscillating (oscillate in self-excited manner) when the semiconductor integrated circuit including the above oscillator circuit is turned on, when a card reader is connected with a card device including the semiconductor integrated circuit, or when a reset signal coming from the USB host device is input into the semiconductor integrated circuit, or the like.

First, the self-excited oscillator circuit 120 generates the 1 MHz clock 151, the frequency of which is multiplied by 48 in the PLL circuit 130. The result is output as a 48 MHz clock 152.

In the PLL circuit 130, a reference numeral 131 denotes a voltage-controlled oscillator circuit (VCO), 132 a frequency divider, 133 a phase frequency detector (PFD), and 134 a low pass filter (LPF).

At start-up, The VCO 131 is oscillating with the frequency referred to as free-running frequency. The clock 152 coming from the VCO 131 is subjected to frequency-division in the frequency divider 132. In the case of using the PLL circuit 130 as a clock multiplier, the frequency division ratio of the frequency divider 132 will serve as the frequency multiplication ratio. In this example, the frequency division ratio is set to 1/48 for the purpose of multiplying, by 48, the 1 MHz clock 151 to derive the 48 MHz clock 152.

A feedback clock 136 is the result of such frequency division, and is compared, in terms of phase and frequency, with the 1 MHz clock 151 in the PFD 133. Through comparison with the 1 MHz clock 151, if the feedback clock 136 is found as advancing in phase or higher in frequency, a charge-down signal 138 outputs the longer pulse than a charge-up signal 137. Conversely, when the feedback clock 136 is found as delaying in phase or lower in frequency compared with the 1 MHz clock 151, the charge-up signal 137 outputs the longer pulse than the charge-down signal 138.

These charge-up and -down signals 137 and 138 are smoothed by the LPF 134, and a frequency control potential 135 is output. In more detail, when the charge-up signal 137 is forwarded to the LPF 134, the frequency control potential 135 is increased, and when the charge-down signal 137 is forwarded to the LPF 134, the frequency control potential 135 is decreased.

In response to the increase of the frequency control potential 135, the VCO 131 is increased in frequency, and in response to the decrease of the frequency control potential 135, the VCO 131 is decreased in frequency. In this manner, negative feedback control is so applied that the feedback clock 136 and the 1 MHz clock 151 have the same frequency and phase. Through operation of the frequency divider 132, the frequency of the 48 MHz clock 152 is controlled to be 48-times that of the 1 MHz clock 151. As such, the PLL circuit 130 operates as 48-times clock multiplier.

The 48 MHz clock 152 derived by multiplying, by 48, the 1 MHz clock 151 is used as a USB reference clock, however, it is not enough to satisfy the standards of ±2500 ppm without any change. The self-excited oscillator circuit 120 has been trimmed during the manufacturing process, and its trim value 154 is stored in the trim register 140. Here, the trim value 154 is the one measured during the manufacturing process, and written into the trim register 140 via the trim signal 155. The trim signal 155 is a signal initially loaded when the semiconductor integrated circuit is turned on or reset. Such signal loading is made from a laser fuse blowout circuit incorporated in the semiconductor integrated circuit, or nonvolatile memory exemplified by EEPROM, MRAM, or flash memory.

Thus trimmed self-excited oscillator circuit 120 becomes able to oscillate at the frequency that remains extremely stable even if process variation occurs. The concern here is that process variation is not the only factor for causing the oscillation frequency to change, and the power supply voltage and temperature will also do. Surely, it is logically possible to trim, with high precision, process variation, power supply voltage, and temperature with a compensator incorporated for the purpose. Practically, however, it is extremely difficult to perform compensation with high precision because a compensator for a certain parameter is dependent on other parameters. As an example, a circuit per se provided to compensate the process variation has a temperature dependence. To trim such a temperature dependence during the manufacturing process, there needs to have a test of temperature increase/decrease, resulting in longer test time. Such a trimming is thus considered difficult in view of test cost. As a possible solution, the oscillation frequency trim circuit 110 is used for compensating any variation such as temperature dependence difficult to trim during the manufacturing process.

In the oscillation frequency trim circuit 110, a reference numeral 111 denotes an SOF detector, 112 a clock pulse counter, 113 a clock number determination circuit, and 114 a frequency trim value register.

From the D+ and D− signals 156 and 157 both being a USB signal, the SOF detector 111 detects SOF packets, which are easily distinguishable from other data flowing through the USB because being unique. Once an SOF packet is input, the SOF detector 111 outputs an SOF detection signal 115 for a cycle through synchronization with the 48 MHz clock 152. Herein, even if the USB host device is connected with a plurality of USB function devices, each of the USB function devices is in a state ready to receive the SOF packet.

Figure 10:
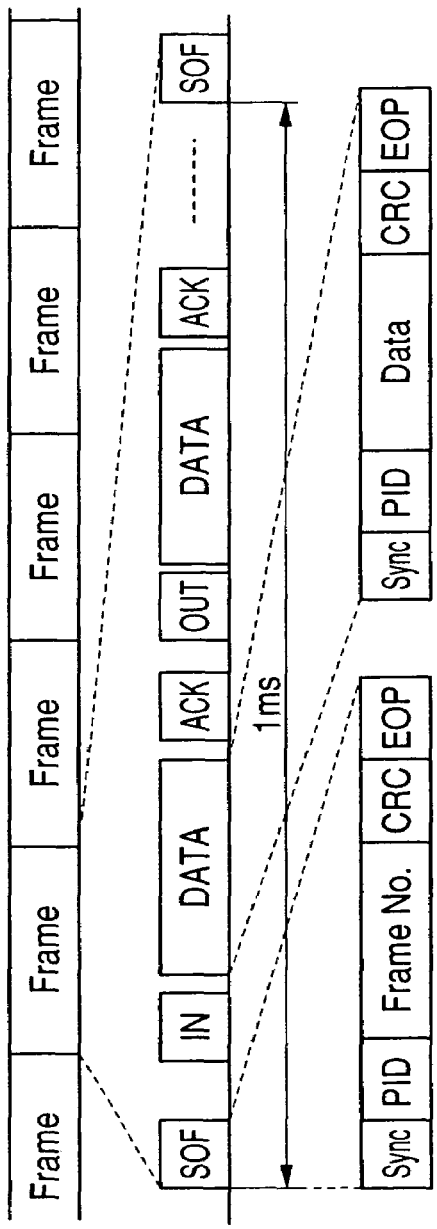
FIG. 10 is a diagram illustrating the flow of data of a USB.

By referring to FIG. 10, the SOF packet includes, in this order, Sync-PID-Frame No.-CRC-EOP for data transmission. Therein, Sync denotes a bit string provided for timing adjustment to capture the data body. PID (Packet ID) denotes a bit string for designating packet type, and if the PID tells the packet type as being an SOF packet, a bit string indicating the SOF packet is accordingly provided. Frame No. denotes the Frame number, which is uniquely assigned to every Frame. CRC (cyclic redundancy check) denotes a bit string for data error detection, and EOP (end of packet) denotes a special status indicating end of packet. The USB is during the progress of differential transmission using two signal lines of D+ and D−. Although the potential of the signal line D+ is inverse of that of the signal line D−, the two signal lines D+ and D− show the same potential only with EOP. This thus allows easy detection of EOP. The SOF packet to be actually detected is EOP-Sync-PID of the previous packet.

The clock pulse counter 112 increments a clock counting signal 116 by 1 for every input of a rising edge of the 48 MHz clock 152, and resets the clock counting signal 116 to 0 in response to any incoming SOF detection signal 115. In this manner, the number of clock pulses can be counted for the duration from an SOF packet to another.

With the USB standards, any two SOF packets have an interval therebetween of 1 ms. If the 48 MHz clock 152 is of correctly 48 MHz, the clock counting signal 116 is supposed to count 48000. Based on such a supposition, the frequency of the 48 MHz clock 152 is corrected.

The clock number determination circuit 113 uses the value of the clock counting signal 116 immediately before the SOF detection signal 115 is output. If the value of the clock counting signal 116 is larger than 48048, the clock number determination circuit 113 decrements 1 from the value of the frequency trim signal 153 coming from the frequency trim value register 114. If the value is smaller than 47952, the value of the frequency trim signal 153 is incremented by 1. A reference numeral 117 denotes an increment command signal for the frequency trim value register 114, and a reference numeral 118 denotes a decrement command signal for the frequency trim value register 114. When the clock counting signal 116 has a value between 47952 and 48048, the value is determined as locating in the dead band of feedback control, and thus is not controlled.

The self-excited oscillator circuit 120 has a frequency trim capability, and therein, the frequency of the 1 MHz clock 151 increases responding to the increase of the frequency trim signal 153, and decreases responding to the decrease thereof. As such, the negative feedback control is applied. The frequency trim signal 153 may be initially provided with a median value to deal with the 1 MHz clock 151 no matter if its frequency is high or low.

Assuming if any two SOF packets have an interval therebetween of 1 ms correctly, the actual frequency of the 48 MHz clock 152 will be stable between 47.952 to 48.048 MHz, i.e., 48 MHz±1000 ppm. The interval between the SOF packets is actually 1 ms±500 ppm, and accordingly the resulting clock will have the precision of 48 MHz±1500 ppm. Although the USB standards have acceptable limits up to 48 MHz ±2500 ppm, 1000 ppm is regarded as a guard band (manufacturing allowance).

In such a manner, the resulting reference oscillator circuit can satisfy the USB standards in terms of precision. Considering the feedback control aiming for the precision under 1000 ppm, the controlled variable at a time is designed to be about 500 ppm. Here, assuming that the frequency drift of about 50000 ppm (5%) is observed to the self-excited oscillator circuit 110 from its initial oscillation frequency, feedback control is required for 100 times for control convergence. It will result in about 100 ms for actual communications after the connection is established between the reference oscillator circuit 100 of the present invention and the USB.

Figure 2:
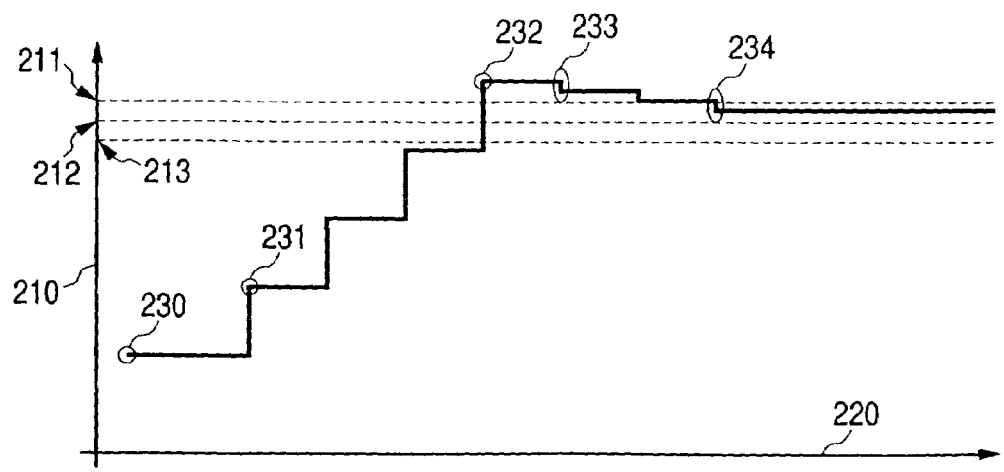
FIG. 2 is a timing chart showing the operation of an oscillation frequency trim circuit provided in the reference oscillator circuit of FIG. 1.

As a measure of prevention, the following control is applied. FIG. 2 is a conceptual diagram of a two-step control scheme in the present invention. In the drawing, a reference numeral 210 denotes a frequency axis of the 48 MHz clock 152, and 220 a time axis. A reference numeral 211 indicates 48.048 MHz, 212 indicates 48 MHz, and 213 indicates 47.952 MHz.

As shown in FIG. 2, the oscillation frequency at start-up of the reference oscillator circuit 100 of the present invention is assumed as being lower than the control target. Based on such a low frequency, control is applied toward the control targets (reference numerals 211 to 213).

First at a control start point 230, a large amount of control is exerted at a time. In more detail, the frequency trim signal 153 is provided with a change variable of ±9 instead of ±1, for example (control points 231 and 232). Assuming that the 48 MHz clock 152 shows the frequency change of 500 ppm when the frequency trim signal 153 is changed in value, e.g. ±1, the frequency will be changed about 4500 ppm after 9 changes. Thereafter, when the oscillation frequency of the 48 MHz clock 152 reaches a range of the control targets 211 to 213, or exceeds the range (control point 232), the change variable of the frequency trim signal 153 is set to ±1. Once the oscillation frequency reaches the range of the control targets 211 to 213, control stability is ensured at the time point. If exceeding the range of the control targets 211 to 213, the oscillation frequency will be brought back to the range with control for 1 to 6 times applied in the reverse direction (control points 233 to 234). Surely, even if the initial frequency of the 48 MHz clock 152 is high, first applied is the control of ±9 and then the control of ±1 based on whether the frequency reaches or exceeds the control target range. If this is the case, the waveform of FIG. 2 will be flipped from top to bottoms but the concept remains the same.

Assuming here that the frequency drift of about −50500 ppm is observed to the 48 MHz clock 152 from its initial frequency, exerting the control of +9 (+4500 ppm) for 12 times will make the frequency exceed the range of the control targets 211 to 213, and reach +3500 ppm. Thereafter, exerting the control of −1 (−500 ppm) for 6 times will make the frequency +500 ppm, satisfying the control targets 211 to 213 and leading to control stability. In short, the frequency reaches the range of the control targets 211 to 213 through the control for 18 times in total. The control frequency under such requirements is the worst-case value in the vicinity of −50000 ppm.

When the value of the frequency trim signal 153 is controlled by +1 from the initial frequency of −50500 ppm, the control for 100 times will make the frequency −500 ppm, reaching the range of the control targets 211 to 213. This tells that two-step control can considerably reduce the time taken to derive control stability.

Figure 3:
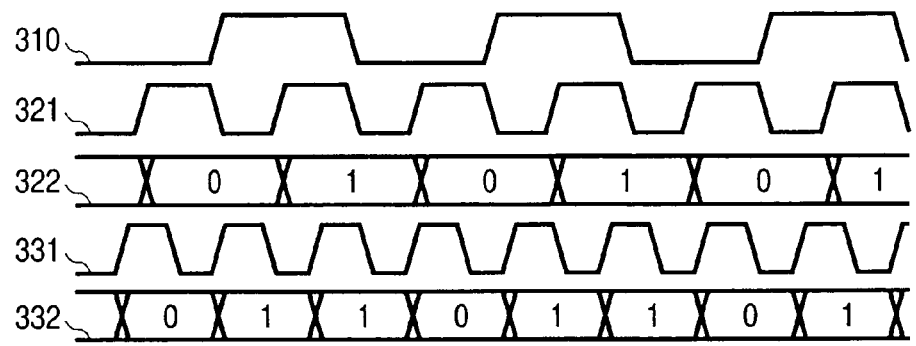
FIG. 3 is a diagram illustrating a possible error when serial data is captured at a wrong timing.

Another issue here is that the USB is a bus for serial half duplex, and has no clock for data synchronization. Thus, there needs to adjust the timing for data capturing on the receiver end. FIG. 3 shows an exemplary case where such a timing for data capturing becomes wrong. To correctly capture a serial data signal denoted by a reference numeral 310, a clock denoted by a reference numeral 321 has to be used for such data capturing. The resulting data captured by such a correct clock 321 will be a data string 322.

Considered here is a case where the serial data signal 310 is captured using any incorrect clock, which is denoted by a reference numeral 331. When the serial data signal 310 is captured by such an incorrect clock 331, the result will be a data string 332. As is obvious from FIG. 3, when the clock timing is wrong, the resulting data string will be imprecise.

With the USB standards, the transmitter and receiver ends have each own reference frequency, and therebetween, any phase difference or slight frequency drift is corrected as required during data communications. Such a synchronization process between the transmitter and receiver ends is referred to as Plesiochronous transmission.

As shown in FIG. 3, if the clock frequency drift occurs between the transmitter and receiver ends during Plesiochronous transmission, this results in a failure of data reading. The failure resultantly prevents detection of SOF packets from the USB data. It means that the initial frequency of the self-excited oscillator circuit 120 has to be correct to the extent as to allow detection of SOF packets, if not satisfying the USB standards.

Figure 4:
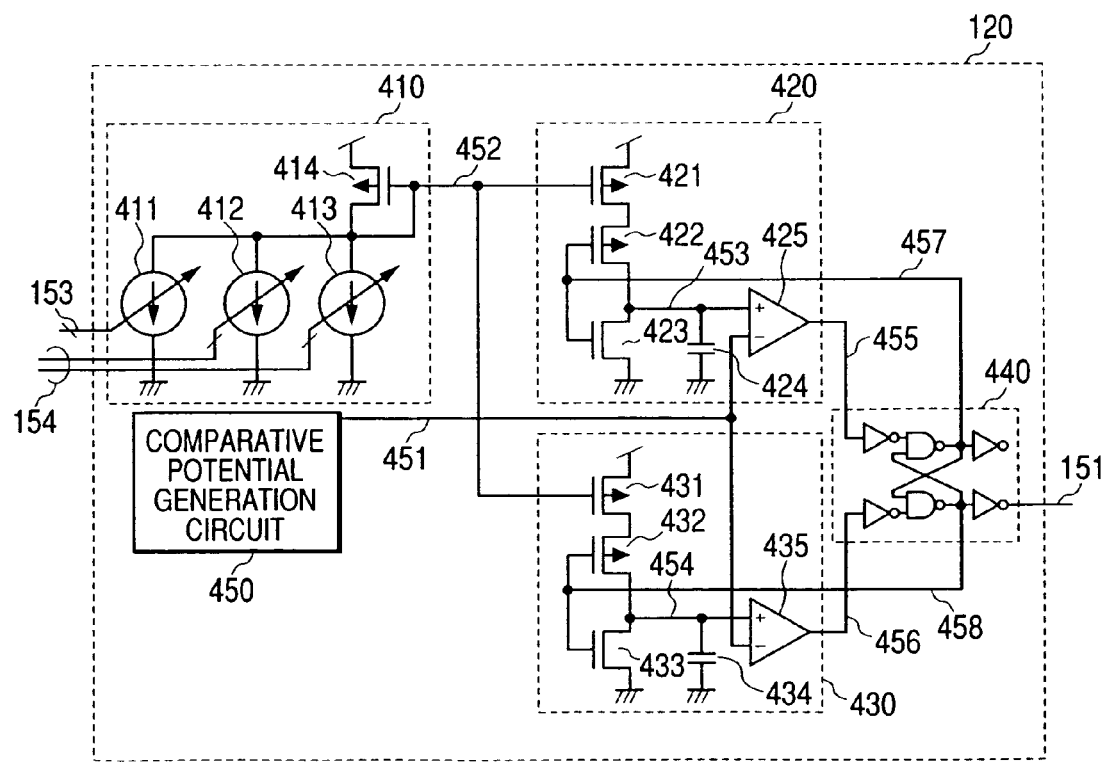
FIG. 4 is a circuit diagram showing an exemplary self-excited oscillator circuit structuring the reference occurrence circuit.

FIG. 4 shows an exemplary high-precision self-excited oscillator circuit 120, which is derivable by a general CMOS process. In FIG. 4, a reference numeral 410 denotes a constant current generation circuit, 420 a positive-phase ramp circuit, 430 a negative-phase ramp circuit, 440 an RS flip-flop, and 450 a comparative potential generation circuit.

In the constant current generation circuit 410, a reference numeral 411 denotes a variable current source for frequency trim (hereinafter, simply referred to as variable current source), 412 a main current source, and 413 a current source for temperature compensation. Although not specifically shown, these current sources 421, 412, and 413 are each provided with a resistor network including a plurality of series resistors and shunt resistors. Specifically, the series resistors are connected in series, and the respective series resistors are coupled at both ends with one end of a shunt resistor. To one end of the respective shunt resistors, a clamp voltage is applied through a CMOS switch that is turned on or off based on control information of a plurality of bits such as the frequency trim signal 153 (trim value 154). Such a structure is so called R2R. The CMOS switch is switch-controlled by a bit corresponding to the control information of a plurality of bits, e.g., the frequency trim signal 153 (trim value 154). The clamp voltage is regarded as a stable reference voltage generated by a so-called reference voltage generation circuit, which compensates any variation of output voltage resulted from the power supply voltage change or temperature change. Accordingly, the voltage generated by the resistor network based on the control information of a plurality of bits, e.g., the frequency trim signal 153 (trim value 154) resultantly becomes stable even if temperature or power supply voltage varies. Such a voltage bias is a current source transistor structuring each of the current sources 411, 412, and 413 to pass the constant current.

In the basic sense, the main current source 412 is used as a basis to determine the current value of the constant current generation circuit 410. Although details are left for later description, the current value increase leads to the frequency increase of the self-excited oscillator circuit 120, and the current value decrease leads to the frequency decrease of the self-excited oscillator circuit 120. Careful consideration must be always given to element variation when LSIs are manufactured in volume using the CMOS process. The current value of the main current source 412 is trimmed during the manufacturing process, and based on the trim value 154, the current value is correspondingly changed. Note here that the trim value 154 shows no change during the process.

Figure 6:
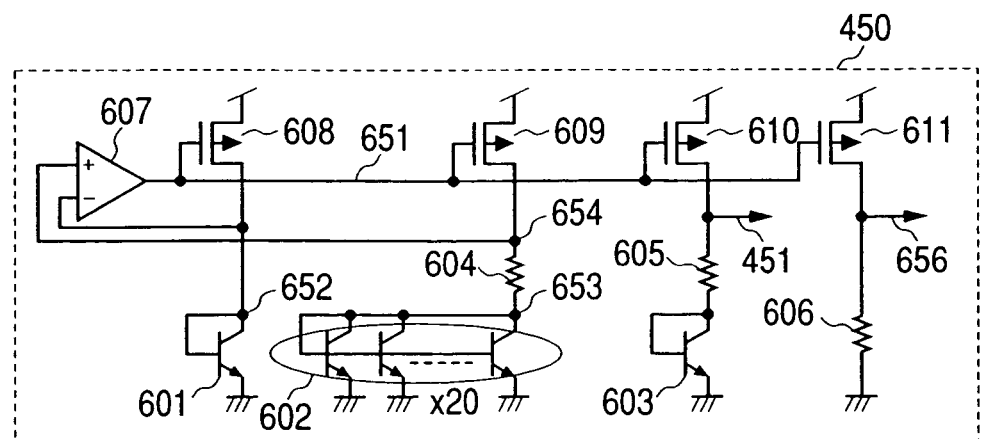
FIG. 6 is a circuit diagram showing an exemplary comparative potential generation circuit provided in the self-excited oscillator circuit of FIG. 4.

The issue here is that the constant current source using the CMOS process basically has the temperature dependence, and thus the current value is decreased responsively when the temperature increases. For compensation thereof, provided is the temperature compensation current source 413, which is so designed that the current value is increased responding to the temperature increase unlike any general current sources. For example, as shown in FIG. 6, a band gap constant-voltage circuit may be used. Although details of FIG. 6 are left for later description, a temperature compensated potential 656 is provided with a potential that is proportionate to the absolute temperature. Current generation from the potential 656 using a voltage-current converter will lead to a current source of a design in which the current value increases responding to the temperature increase. Conversely thereto, if the temperature dependence of the main current source 412 shows that the current value increases responding to the increase of the temperature increase, a current mirror is used to reverse the current direction of the temperature compensation current source. In this manner, the temperature dependence of the main current source 412 can be cancelled out. In more detail, the current value of the temperature compensation current source 413 is set to the trim value 154 so as to cancel out the temperature dependency between the main current source 412 and the temperature compensation current source 413. As a result, the temperature dependency of the current can be reduced to a considerable degree. Note here that, as already described above, canceling out the temperature dependency during the manufacturing process is difficult in view of test time. Similarly, to satisfy the USB standards, canceling out the temperature dependency using only the temperature compensation current source 413 is also difficult.

As a measure taken therefor, the oscillation frequency trim circuit 110 is provided. In response to the frequency trim signal 153 output from the oscillation frequency trim circuit 110, the variable current source for frequency trim 411 changes the current value. That is, in response to the increase of the frequency trim signal 153, the current value of the variable current source 411 increases, and in response to the decrease of the frequency trim signal 153, the current value of the variable current source 411 decreases.

Figure 5:
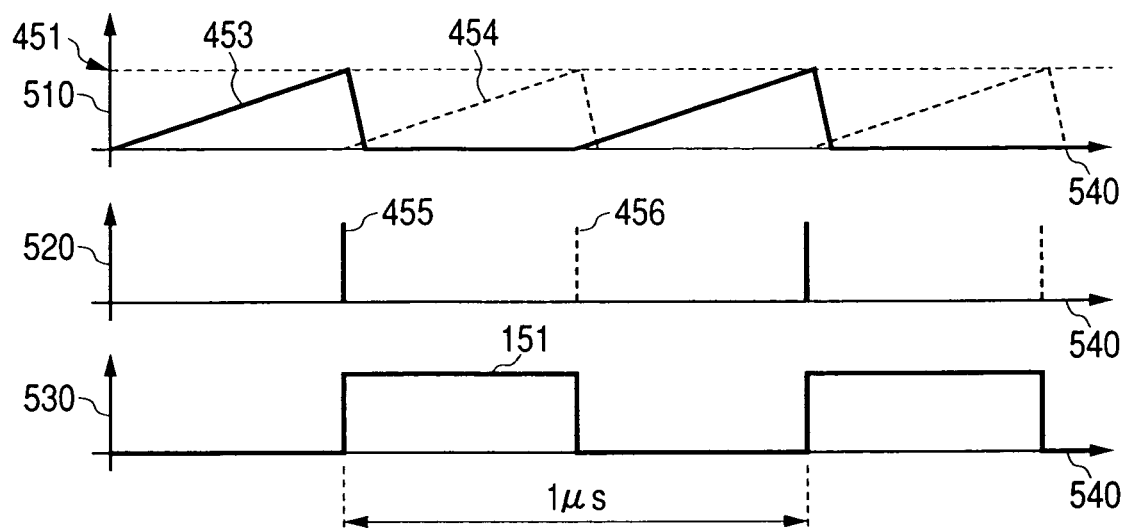
FIG. 5 is a timing chart showing the transition of a node potential of the self-excited oscillator circuit of FIG. 4.

With such three current sources, the current value of the constant current generation circuit 410 in its entirety is kept constant with very high precision. Herein, surely, only the oscillation frequency of the self-excited oscillator circuit 120 is kept constant in the end, and any change occurred thereto due to any other circuits is compensated by the constant current generation circuit 410. The current value is converted into a bias potential 452 by a bias PMOS 414. The current generated in the constant current generation circuit 410 is forwarded to the positive- and negative-phase ramp circuits 420 and 430 through the bias potential 452. The operation of the ramp circuits 420 and 430 is described based on the transition of the respective node potentials of FIG. 5. In FIG. 5, a reference numeral 510 denotes a potential axis of the positive- and negative-phase ramp potentials 453 and 454, 520 a potential axis of a set signal 455 and a reset signal 456, 530 a potential axis of the 1 MHz clock 151, 540 a time axis, 453 a potential of the positive-phase ramp potential, 454 a potential of the negative-phase ramp potential, 455 a potential of the set signal 455, 456 a potential of the reset signal 456, 151 a potential of the 1 MHz clock 151, and 451 a potential of the comparative potential 451.

Explanation will be made of first in a case where the positive-phase ramp circuit 420 is in OFF status. Because a disable potential 457 of the positive-phase ramp circuit is high (Hi) in level, a positive-phase reset NMOS 423 is turned ON, and the positive-phase switch PMOS 422 is turned OFF. Accordingly, the positive-phase ramp potential 453 is stable at a ground potential. If the disable potential 457 of the positive-phase ramp circuit is then reduced to a low (Lo) level, the positive-phase reset NMOS is turned OFF, and the positive-phase switch PMOS is turned ON. Thus, a capacitor 424 is charge-injected, and the positive-phase ramp potential 453 responsively increases (refer to FIG. 5). When the positive-phase ramp potential 453 exceeds the comparative potential 451, the set potential 455 as an output from a comparator 425 rises in level from Lo to Hi. With the set signal 455 functioning as such, the RS flip-flop 440 flips into the opposite status, and the disable potential 457 of the positive-phase ramp circuit rises in level to Hi. In this manner, the positive-phase ramp circuit transits to the OFF status again.

With the RS flip-flop 440 functioning as such, when the disable potential 457 of the positive-phase ramp circuit is Lo in level, the disable potential 458 of the negative-phase ramp circuit is Hi in level. At this time, the negative-phase ramp circuit 430 is in the OFF status. It means that the negative-phase reset NMOS 433 is turned ON, the negative-phase switch PMOS 432 is turned OFF, and the negative-phase ramp potential 454 is stable at the ground potential. By the positive-phase ramp circuit 420 functioning as such, the disable potential 458 of the negative-phase ramp circuit is reduced in level to Lo by the flipping of the RS flip-flop 440. This turns OFF the negative-phase reset NMOS 433, and turns ON the negative-phase switch PMOS 432, resulting in the increase of the negative-phase ramp potential 454 (refer to FIG. 5). Similarly to the positive-phase ramp potential 453, when the negative-phase ramp potential 454 exceeds the comparative potential 451, the reset potential 456 output from the comparator 435 responsively rises, and the RS flip-flop 440 flips into the opposite status.

During when the negative-phase ramp circuit 430 is in operation, the positive-phase ramp circuit 420 is in the OFF status, and the positive-phase ramp potential 453 is dropped to the ground potential. Thereafter, through alternating operation of the positive- and negative-phase ramp circuits 420 and 430, the RS flip-flop 440 flips on a regular basis. The resulting output is the 1 MHz clock 151.

Here, the positive- and negative-phase current source PMOSs 421 and 431 are so designed as to have the same gate length (Lg) and gate width (W) as the bias PMOS 414. Therein, the current having the same level as the current generated in the constant current generation circuit 410 flows into the positive- and negative-phase current source PMOSs 421 and 431. The equation 1 below expresses the potential V of the ramp potentials 453 and 454 with a lapse of time t after the ramp circuits 420 and 430 are both turned ON, where I denotes the value of the current generated in the constant current generation circuit 410, and C denotes the capacity of the capacitors 424 and 434.

[Equation 1]

From the equation 1, the time taken to reach the comparative potential 451 (Vc) after the ramp circuits 420 and 430 are turned ON can be expressed as follows:

[Equation 2]

Assuming that the response speeds of the comparators 425 and 435, and the RS flip-flop 440 are all negligibly small, the values of C, Vc, and I are so set as to derive 0.5 μs for t of Equation 2. Through such value setting, the oscillation frequency of 1 MHz can be derived.

Out of these three design parameters, C may be the value of a MIM capacitor (MIM: Metal Insulator Metal, capacitor in which a gate layer or a wiring layer is used as an electrode). If this is the case, the capacity can be stable with respect to the temperature and the power supply voltage. The manufacturing manner of I is as described above. By referring to FIG. 6, the manufacturing manner of Vc is described.

FIG. 6 shows the circuit diagram of the comparative potential generation circuit 450. PMOSs 608 to 611 are equal in value of Lg and W, and also equal in current amount as are sharing the same PMOS gate potential 651. NPN transistors 601 and 602 are diode-connected, and the NPN transistor 602 is so designed as to have the emitter area 20 times larger than that of the NPN transistor 601. Assuming that the current flowing into the NPN transistor 601 is It1, the potential of a node 652 is Vt1, and the opposite-direction leakage current of the NPN transistor 601 is Is, the relationship there among is expressed by the following equation. In the following equation, a reference character k denotes a Boltzmann constant, T denotes an absolute temperature, and q denotes an elementary charge.

[Equation 3]

Similarly, assuming that the current flowing into the NPN transistor 602 is It2, and the potential of a node 653 is Vt2, the current It2 of the NPN transistor 602 is expressed by the following equation.

[Equation 4]

As described above, the PMOSs 608 and 609 receive the same amount of current, and thus It1=It2. As a result of the negative feedback by an opAMP 607, the potentials of the nodes 652 and 654 have been subjected to imaginary short, and thus equalized. With the size of a resistor 604 being R1, the following two equations are derived.

[Equation 5]

[Equation 6]

Solving Equation 6 using Equation 3 leads to the following equation.

[Equation 7]

As Equation 7 shows, using the circuit of FIG. 6 can provide the current that is determined by the emitter area ratio of the NPN transistors. Note here that, as Equation 7 shows, the current It1 is proportional to the absolute temperature T. Thus, there still remains a problem that the temperature coefficient is high.

As a measure taken therefor, a current mirror is used to flow the current It1 to the PMOS 610. With the size of a resistor 605 being R2, the voltage at both ends of the resistor 605 is expressed by the following equation.

[Equation 8]

The resulting voltage becomes proportional to the absolute temperature T, i.e., voltage having a positive temperature dependency. Conversely, the emitter-base voltage of an NPN transistor 603 is known as having a negative temperature dependency. Thus, by performing their value setting with extreme caution, the temperature dependency can be successfully cancelled out.

With circuit structure as such, the resulting comparative potential 451 becomes considerably stable with respect to the temperature. Further, the current mirror is used to flow the current It1 to the PMOS 611. To a resistor 606 connected in series to the PMOS 611, flown is the voltage proportionate to the absolute temperature T. Accordingly, the temperature compensated potential 656 becomes proportionate to the temperature, and the result can be used for the temperature compensator. With the self-excited oscillator circuit 120 in this example, the temperature compensation current source 413 is in charge of such temperature compensation. Although the temperature compensated potential 656 is provided to the temperature compensation current source 413, such provision is not shown in FIG. 4 for brevity.

The self-excited oscillator circuit 120 of FIG. 4 is provided with the two ramp circuits 420 and 430, thereby encapsulating the reset time of the ramp potentials 453 and 454. The time taken to reset the ramp potential is dependent on the current driving force of the MOS. The MOS is high in temperature dependency, and falls considerably out of primary characteristics, resulting in difficulty in temperature compensation. As such, including the two ramp circuits 420 and 430 leads to a highly-precise oscillation frequency.

Figure 7:
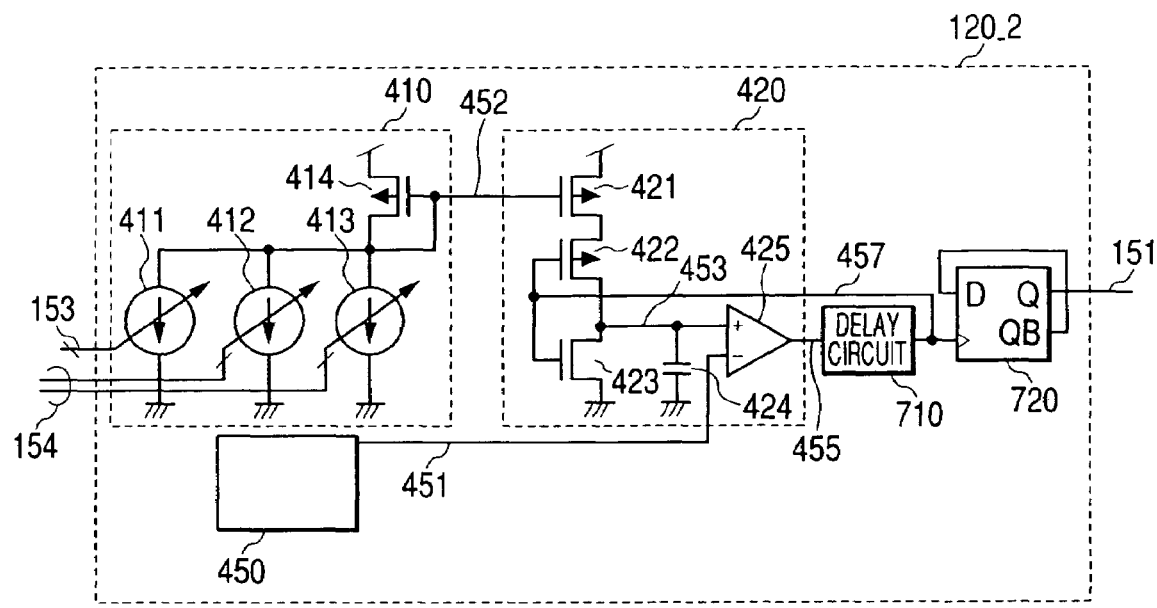
FIG. 7 is a circuit diagram of a simplified self-excited oscillator circuit that is a structure-simplified version of the self-excited oscillator circuit of FIG. 4.

FIG. 7 shows a self-excited oscillator circuit 120_2, which is a simplified version of the self-excited oscillator circuit 120 of FIG. 4. As shown in FIG. 7, the self-excited oscillator circuit 120_2 includes only one ramp circuit 420, and is newly provided with a delay circuit 710 and a D-flip-flop 720. Here, the capacitor 424 in the ramp circuit 420 is increased in size to have better precision. In this sense, including only one ramp circuit can save the circuit area to a considerable degree.

Figure 8:
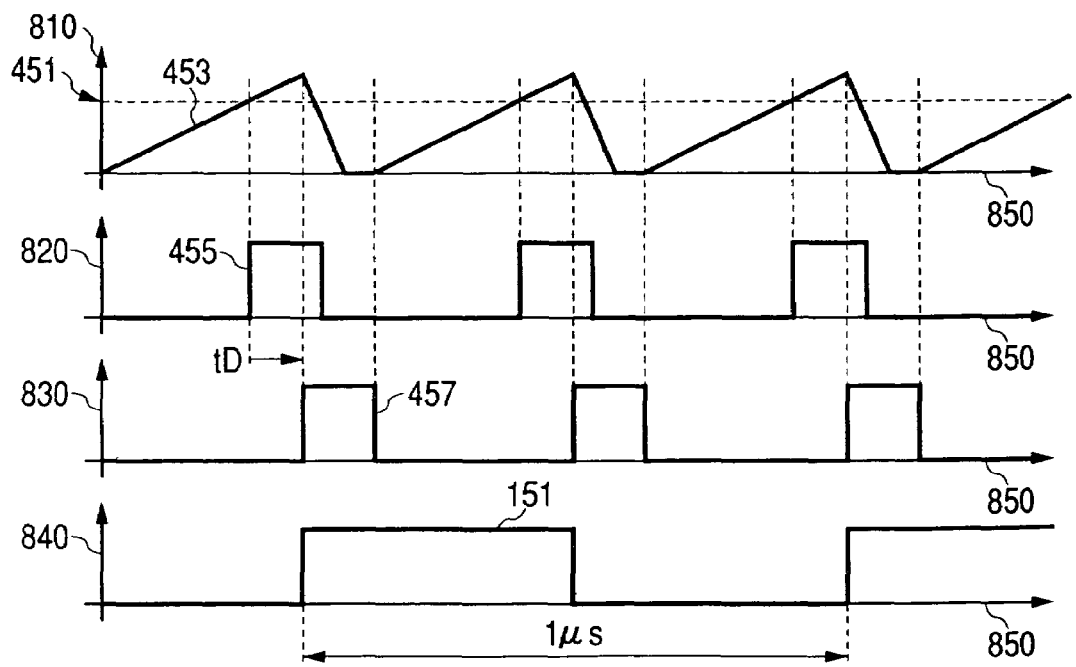
FIG. 8 is a timing chart showing the transition of a node potential of the self-excited oscillator circuit of FIG. 7.

FIG. 8 shows the transition of the respective node potentials of the self-excited oscillator circuit 120_2. By referring to FIG. 8, the self-excited oscillator circuit 120_2 is described.

Explanation will be made at first when the positive-phase ramp circuit 420 is in OFF status. Because the disable potential 457 of the positive-phase ramp circuit is high (Hi) in level, the positive-phase reset NMOS 423 is turned ON, and the positive-phase switch PMOS 422 is turned OFF. Accordingly, the positive-phase ramp potential 453 is stable at the ground potential. If the disable potential 457 of the positive-phase ramp circuit is then reduced to a low (Lo) level, the positive-phase reset NMOS is turned OFF, and the positive-phase switch PMOS is turned ON. Thus, the capacitor 424 is charge-injected, and the positive-phase ramp potential 453 responsively increases (refer to FIG. 8). When the positive-phase ramp potential 453 exceeds the comparative potential 451, the set potential 445 output from the comparator 425 rises in level from Lo to Hi. Until now, the self-excited oscillator circuit 120_2 operates similarly to the self-excited oscillator circuit 120 of FIG. 4. The set potential 455 is then delayed by tD in the delay circuit 710, and reaches the disable potential 457 of the positive-phase ramp circuit. In the mean time, the positive-phase potential 453 keeps increasing. Once the disable potential 457 of the positive-phase ramp circuit is provided, the positive-phase ramp circuit 420 is turned OFF, and the positive-phase ramp potential 453 starts decreasing. With such a reason, the set potential 455 keeps outputting Hi level as long as the positive-phase ramp potential 453 is exceeding the comparative potential 453, resulting in a pulse width of a certain level. Herein, needless to say, the disable potential 457 of the positive-phase ramp circuit as a result of delaying the set potential 455 by tD also has a pulse width of a certain level. For the duration of the pulse width, the positive-phase ramp circuit 420 keeps being reset, and accordingly the positive-phase ramp potential 453 drops down to the ground level. Thereafter, once the disable potential 457 of the positive-phase ramp circuit drops down to reach the Lo level, this turns ON the positive-phase ramp circuit 420, and the above operation is repeated. The D-flip-flop 720 has a negative output QB connected to an input D, and every time a clock input rises, the output is inversed. The clock input of the D-flip-flop is at the disable potential 457 of the positive-phase ramp circuit, and as shown in FIG. 8, the positive output Q of the D-flip-flop becomes the 1 MHz clock 151. Herein, surely, the main current source 412 and the temperature compensation current source 413 are set differently between the self-excited oscillator circuits 120 and 120_2.

The self-excited oscillator circuit 120_2 is required to have the same level of precision as the delay circuit 710, and thus the design difficulty thereof is higher than the self-excited oscillator circuit 120. On the other hand, there is an advantage of smaller layout area, as described above.

Figure 9:
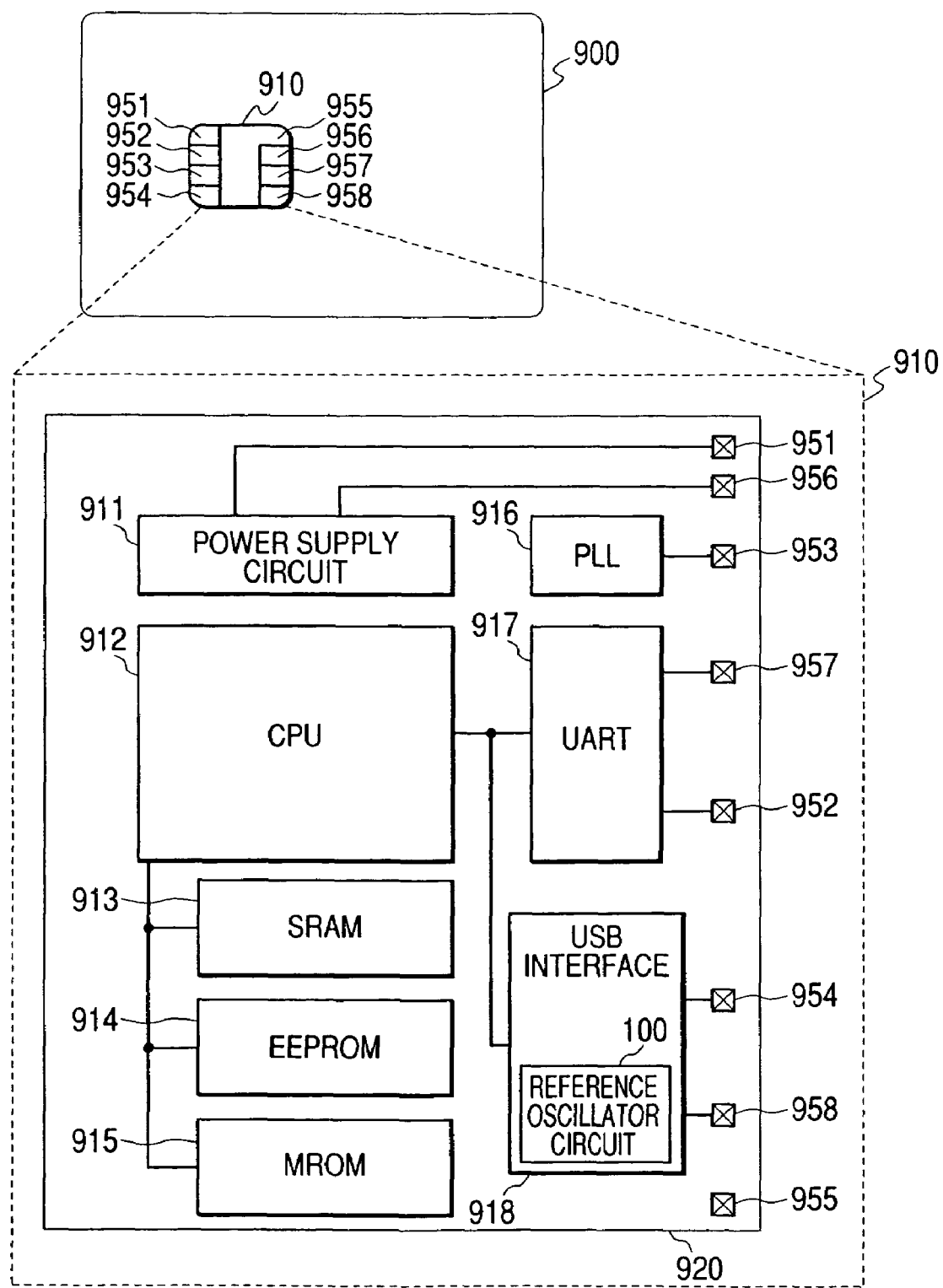
FIG. 9 is a plan view of an IC card adopting an IC card microcomputer including the reference oscillator circuit of FIG. 1.

FIG. 9 shows an exemplary case where the USB reference oscillator circuit 100 structured as such is applied to an IC card LSI exemplified by an IC card microcomputer (IC card micon). The IC card in this example is presumably the one including a USB communications terminal to the ISO 7816, which is the international standards of contact-type IC card.

By referring to FIG. 9, a reference numeral 900 denotes an IC card, 910 an IC card LSI, 911 a power supply circuit, 912 a CPU (Central Processing Unit), 913 SRAM (Static Random Access Memory), 914 EEPROM (Electric Erasable Programmable Read Only Memory), 915 MROM (Mask Read Only Memory), 916 a PLL, 917 a UART, and 918 a USB interface. The USB interface 918 carries thereon the reference oscillator circuit 100 of the present invention. The ID card 900 includes various terminals, i.e., Vcc terminal 951, Reset terminal 952, Clock terminal 953, RFU (Reserved for Future Use) terminal 954, Ground terminal 955, Vpp terminal 956, I/O terminal 957, and another RFU terminal 958. The IC card 900 is formed to a card substrate exemplified by a multilayer wiring substrate or a complex wiring substrate. Formed to one surface of the card substrate are the card terminals 951 to 958, to which external terminals of the incorporated IC card micon are coupled. The surface of the card substrate on which the IC card micon is incorporated is sealed by cap, resin, or the like. A reference numeral 920 denotes a semiconductor substrate (semiconductor chip) such as single crystal silicon onto which the IC card LSI 910 is formed.

The ISO 7816 is adopting UART for interface with outside. UART is widely popular as standards for serial data transfer, and exemplarily in PCs, UART is adopted to the serial port called RS232-C. Data exchanged through half duplex of UART 917 (two-way communications in which reception and transmission cannot be executed at the same time) is processed by the CPU 912. As working memory for the process, the SRAM 913 is provided. The MROM 915 stores data common among the IC cards 900 such as OS program, and the EEPROM 914 stores data unique to the respective IC cards 900, e.g., IC card identification number. The result of the process executed by the CPU 912 is output to the outside through the UART 917 again.

Here, the voltage of the power supply Vcc terminal 951 is relatively high as 5V, and thus is reduced in the power supply circuit 911 for distribution to the respective circuits. The power supply Vpp is a terminal provided to enhance the power supply capacity of the Vcc terminal 951 if writing to the EEPROM requires a large amount of current. In response to the clock input from the Clock terminal 953, the PLL 916 generates any clock needed for the CPU 912 and others.

As such, the IC card adhering to the ISO 7816 uses the UART for communications with outside. Through replacement of the UART by USB, the user s usability can be preferably increased. In view thereof, the USB interface 918 is additionally provided. The reference oscillator circuit 100 of the present invention serves as a component of the USB interface 918. As such, by including the reference oscillator circuit 100 directly in the USB interface 918, USB communications can be carried out without including a quartz oscillator outside of the IC card LSI 910. Note here that although FIG. 9 shows the PLL 916 being separately provided for brevity, the reference oscillator circuit 100 carries therein the PLL circuit 130. Thus, the PLL 916 may not be provided, and the PLL circuit 130 may operate therefor. In that case, for communications using UART, a reference clock of the PLL circuit 130 is replaced with a clock coming from the Clock terminal 953.

The USB communications terminals D+ and D− are assigned to the RFU terminals 954 and 958 of the ISO 7816 standards. RFU stands for Reserved for Future Use, and this works good for the RFU terminals 954 and 958 because ISO 7816 standards have no specific usage therefor. Other than those, USB requires Vbus and Ground terminals serving as power source terminals, and these are assigned to the Vcc terminal 951 and the Ground terminal 955, respectively.

Figure 11:
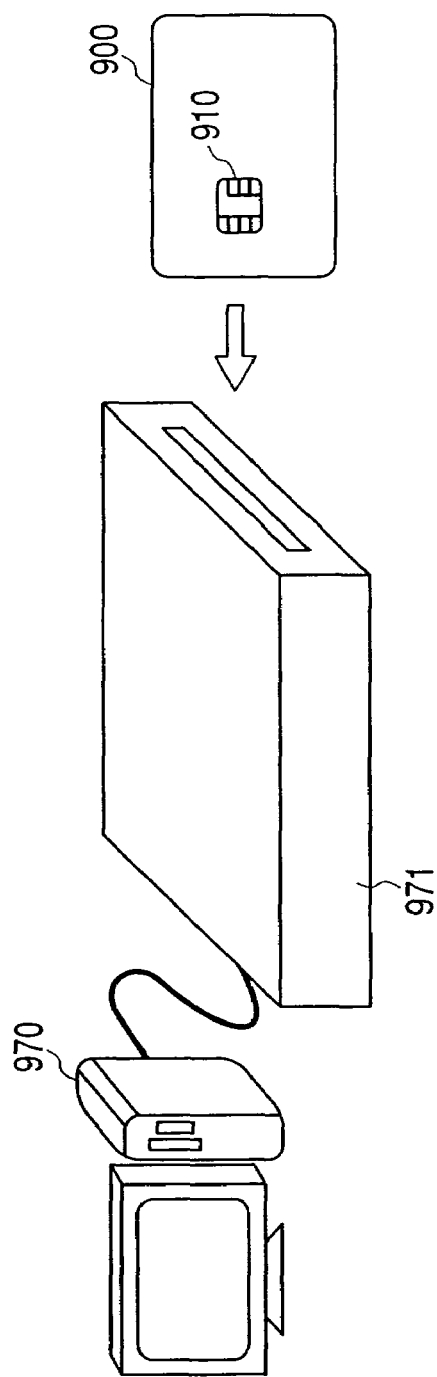
FIG. 11 is a diagram illustrating an IC card reader connected to a PC serving as a USB host device.

FIG. 11 shows an exemplary IC card reader. A PC 970 serves as a USB host device. A card reader 971 is connected to the USB interface connector of the PC 97. The card reader 971 is detachably attached with the IC card 900, and has an electrical connection path for allowing a connection establishment between the PC 970 serving as a USB host device and the external connection terminals 951 to 958 of the attached IC card 900. Here, a sampling clock on the side of a USB client is generated in an on-chip oscillator circuit of the IC card micon incorporated to the IC card, and thus the card reader is not required to include an oscillator such as a quartz oscillator. As such, through integration of every USB function device including the reference oscillator, required for the IC card reader is only electrical junction between the IC card and the USB signal line, leading to considerable cost reduction of the IC card reader.

The IC card reader of the current type used for connection between USB and ISO 7816-compatible IC card needs a power supply unit or others to adopt the power supply to the ISO 7816 standards coming from the IC, quartz oscillator circuit, and USB for converting USB signals to UART. Compared with the IC card including the reference oscillator circuit of the present invention, the entire cost thereof is thus high.

The operation effects of the semiconductor integrated circuit described above are now summarized.

The on-chip reference oscillator circuit 100 in the semiconductor integrated circuit such as an IC card micon decodes SOF packets defined by the USB standards, and executes negative feedback control over its oscillation frequency using an interval of the SOF packets as a reference time unit. Thus, the SOF packets have the precision of ±500 ppm, and the precision of ±2500 ppm required for the USB equipment can be thus successfully achieved.

Although the precision needed for SOF packet detection is not necessarily high as ±2500 ppm, the precision of a certain level is needed. To provide the precision needed for SOF packet detection, a ramp circuit as a combination of a current source and a capacitor may be used to structure a self-excited oscillator circuit. In this case, two of such a ramp circuit may be used, and the time for resetting one ramp circuit may be encapsulated by the operation of the other ramp circuit. With such a structure, the resulting self-excited oscillator circuit can be high in precision.

The IC card micon may include a reference oscillator circuit to reduce the cost of the IC card reader to a considerable degree.

As such, while the invention provided by the inventor has been described in detail based on the embodiment, the foregoing description is in all aspects illustrative and not restrictive. It is understood that numerous other modifications and variations can be devised without departing from the scope of the invention.

For example, the external interface circuit is not limited to the USB interface, and any other interfaces carrying out the Plesiochronous communications will do. The semiconductor integrated circuit is not limited to the IC card micon, and may be used to any other types of semiconductor integrated circuits, e.g., control micro computers, and system on-chip system LSIs. Moreover, the card device to which such a semiconductor integrated circuit is not limited to the IC card, and can be applied to an SIM card for mobile phones, a multifunction memory card for enhancement of security function, or the like. The memory to be mounted onto the semiconductor integrated circuit is not limited to the EEPROM, and may be nonvolatile memory exemplified by flash memory and MRAM. When no data communications is carried out between the USB host device and the semiconductor integrated circuit, if a connection is established with the USB host device, the oscillator circuit 100 can perform adjustment of the oscillation frequency utilizing any incoming SOF packets. The USB equipment serving as a USB client is not limited to the IC card reader, and may be a hard disk, keyboard, display, or others for USB connection. The sampling clock on the client side may be generated by the IC-on-chip reference oscillator circuit. Even when no SOF packet is coming, the oscillator circuit 100 is so structured as to provide the oscillation precision of a level enough for identifying any SOF packet input using the ramp circuit of FIG. 4. If the compensator can be enhanced for property variation, a ring oscillator circuit may be possibly used to provide such an oscillation precision.

What is claimed is:

1. A semiconductor integrated circuit, comprising:
an external interface circuit inputting or outputting packet data having a predetermined data format,
wherein said external interface circuit includes a clock generating circuit generating an operating clock signal for said external interface circuit, and
wherein said clock generating circuit includes a self-excited oscillator circuit, and controls an oscillation frequency of said self-excited oscillator circuit depending on first data included in said packet data.

2. A semiconductor integrated circuit according to claim 1, wherein said clock generating circuit includes a trimming register, and trims said oscillation frequency of said self-excited oscillator circuit depending on a value of said trimming register.

3. A semiconductor integrated circuit according to claim 2, wherein said semiconductor integrated circuit is an IC card microcomputer.

4. A semiconductor integrated circuit according to claim 1, wherein said clock generating circuit includes a controlling circuit, and a PLL circuit outputting said operating clock signal after multiplying said oscillation frequency of said self-excited oscillator circuit, and
wherein said controlling circuit counts fixed time intervals of said first data by said operating clock signal, and controls said oscillation frequency to match a target value in response to a result of counting.

5. A semiconductor integrated circuit according to claim 1,
wherein said clock generating circuit includes a controlling circuit, and
wherein said controlling circuit counts an interval of said first data by said operating clock signal, and controls said oscillation frequency of said self-excited oscillator circuit.

6. A semiconductor integrated circuit according to claim 5, further including a second external interface circuit for UART,
wherein said second external interface circuit has a data terminal inputting or outputting a data signal,
wherein said external interface circuit has a D+ terminal and a D− terminal, and inputs said packet data via said D+ and D− terminals, and
wherein said first data included in said packet data is a SOF packet which is placed at a head portion of said packet data.

7. A semiconductor integrated circuit according to claim 6, wherein said semiconductor integrated circuit is an IC card microcomputer.

8. A semiconductor integrated circuit according to claim 1, wherein said self-excited oscillator circuit starts oscillating after said semiconductor integrated circuit is provided with a voltage.

9. A semiconductor integrated circuit according to claim 1,
wherein said clock generating circuit includes a Phase-Locked Loop circuit, and
wherein said Phase-Locked Loop circuit inputs a clock from a second external interface, and generates an internal clock using said inputted clock.

10. A semiconductor integrated circuit, comprising:
an external interface circuit inputting or outputting packet data,
wherein said external interface circuit includes a clock generator generating an operating clock signal for said external interface circuit, and
wherein said clock generator includes a self-excited oscillator circuit, and controls an oscillation frequency of said self-excited oscillator circuit depending on SOF data included in said packet data.

11. A semiconductor integrated circuit according to claim 10,
wherein said clock generator counts an interval of said SOF data by said operating clock signal, and controls said oscillation frequency.

* * * * *